356-138

SEARCH ROOM

March 10, 1970 H. A. SCHELLENBERG 3,499,714

MASK ALIGNMENT APPARATUS

Filed Oct. 13, 1966 5 Sheets-Sheet 1

INVENTOR.
Hans A. Schellenberg
BY Flehr, Hohbach, Test, Albritton & Herbert
Attorneys INVENTOR.
Hans A. Schellenberg
BY Flehr, Hohbach, Test, Albritton & Herbert
Attorneys INVENTOR.
Hans A. Schellenberg
BY Flehr, Hohbach, Test, Albritton & Herbert
Attorneys INVENTOR.
Hans A. Schellenberg
BY Fleht, Hohbach, Test, Albritton & Herbert
Attorneys INVENTOR.
Hans A. Schellenberg
BY Fleher, Hohbach, Test, Albritton & Herbert
Attorneys 3,499,714

MASK ALIGNMENT APPARATUS

Hans Albert Schellenberg, Menlo Park, Calif., assignor to Electroglas Inc., Menlo Park, Calif., a corporation of California Filed Oct. 13, 1966, Ser. No. 586,560
Int. Cl. G01j 3/04
U.S. Cl. 356—138 26 Claims

ABSTRACT OF THE DISCLOSURE

Mask alignment apparatus for aligning a wafer and a mask for carrying out operations on the mask in which the wafer is positioned and then moved onto a vacuum chuck assembly for exposure through the mask.

This invention relates to a mask alignment apparatus and particularly to a mask alignment apparatus for use in making semiconductor devices.

In the manufacture of semiconductor devices, there is a great need for apparatus which can be utilized for automating the production of such semiconductor devices. There is a particular need for apparatus which can be utilized for aligning the mask and the substrate on which the exposure is to be made and to do so repeatedly and automatically.

In general, it is an object of the present invention to provide a mask alignment apparatus which can be utilized for aligning the mask and the substrate.

Another object of the invention is to provide apparatus of the above character in which the mask is loaded substantially automatically and the substrate is brought into position automatically.

Another object of the invention is to provide apparatus of the above character in which good contact can be made for exposure of small geometries such as one micron lines.

Another object of the invention is to provide apparatus of the above character in which the loading mechanism can be readily adjusted.

Another object of the invention is to provide a loading mechanism of the above character which cannot become jammed mechanically.

Another object of the invention is to provide apparatus of the above character in which the X–Y ratio is adjustable.

Another object of the invention is to provide apparatus of the above character in which folded optics are utilized.

Another object of the invention is to provide apparatus of the above character which can be operated by relatively unskilled personnel.

Additional objects and features of the invention will appear from the following description in which the preferred embodiment is set forth in detail in conjunction with the accompanying drawings.

Referring to the drawings.

Figure 1:
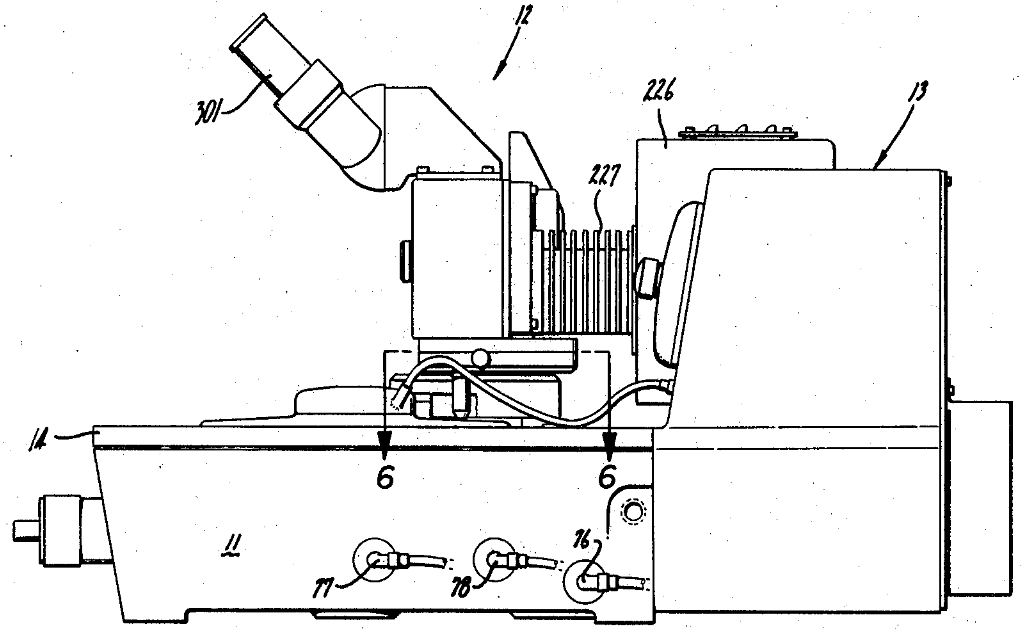
FIGURE 1 is a side elevational view of a mask alignment apparatus incorporating the present invention.
Figure 2:
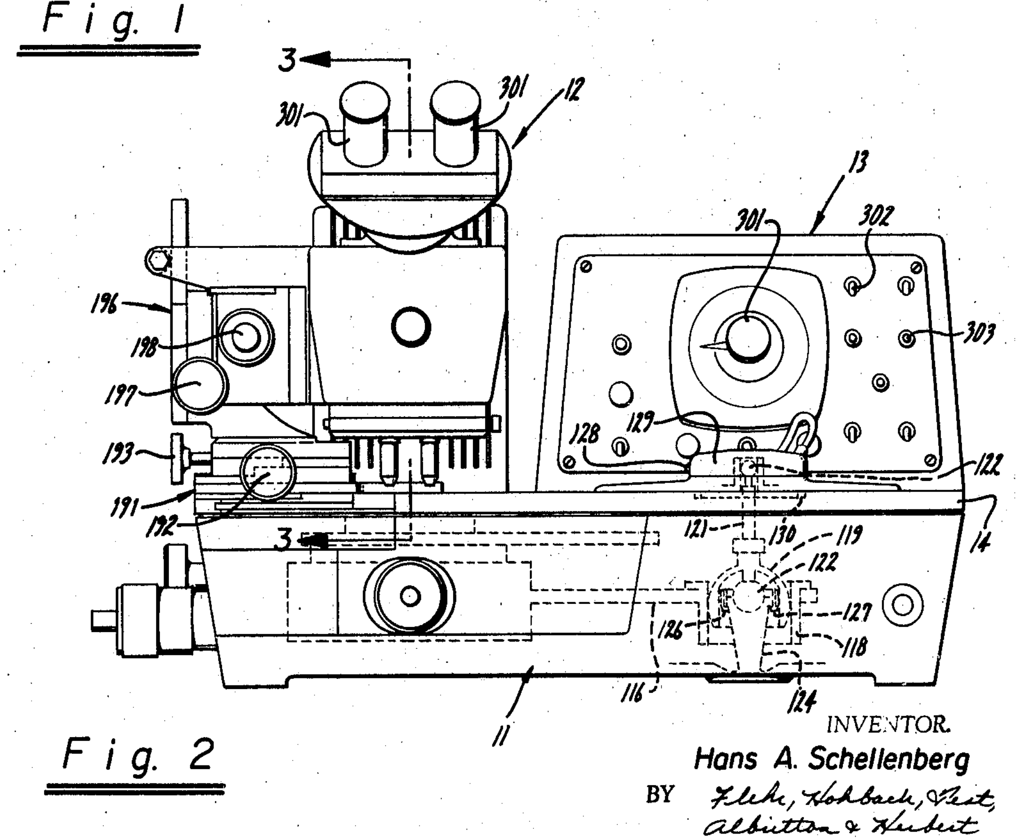
FIGURE 2 is a front elevational view of the mask alignment apparatus shown in FIGURE 1.
Figures 3, 4:
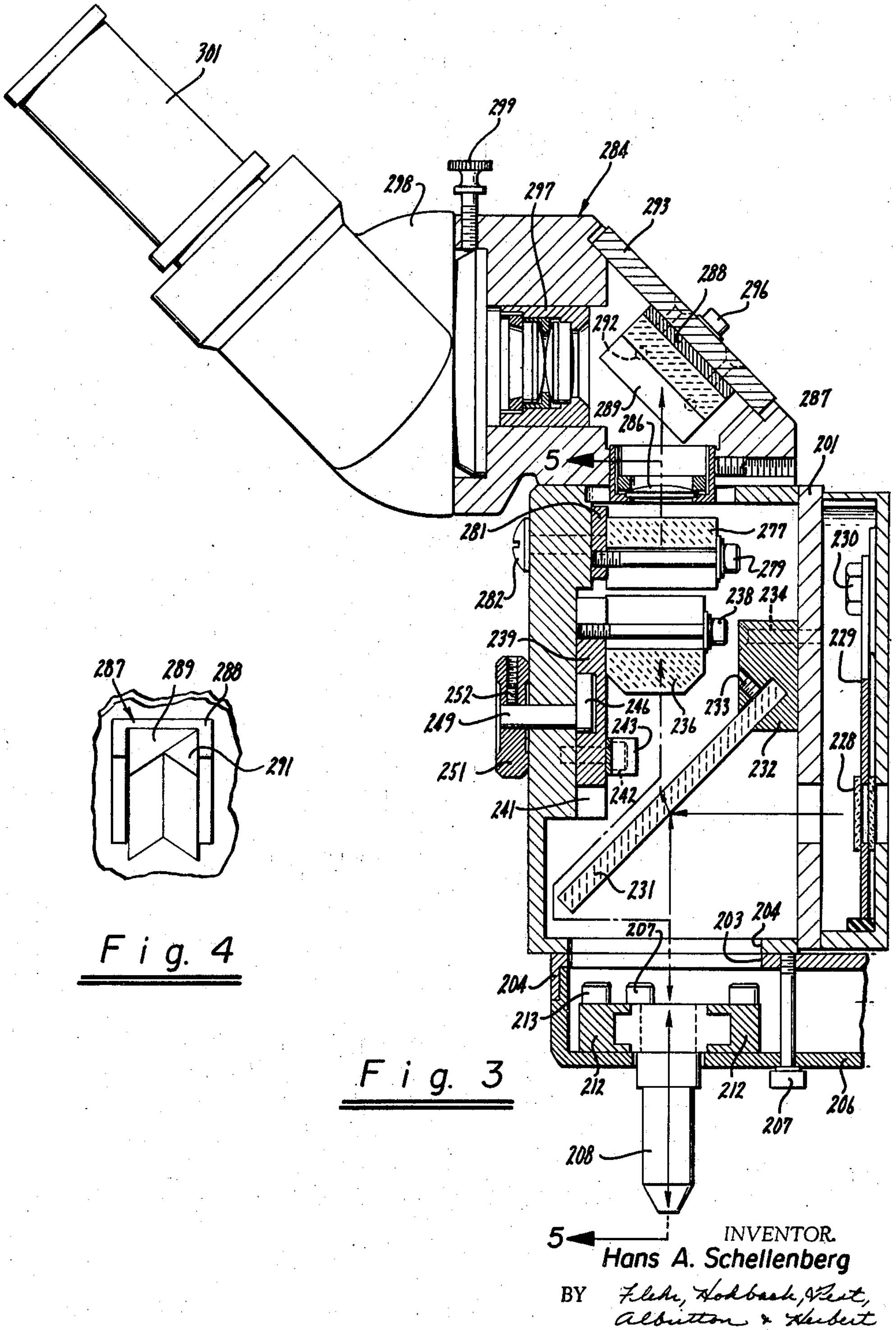
FIGURE 3 is a cross-sectional view taken along the line 3—3 of FIGURE 2.
FIGURE 4 is an isometric view of one of the roof prism assemblies utilized in the folded optics shown in FIGURE 3.
Figure 5:
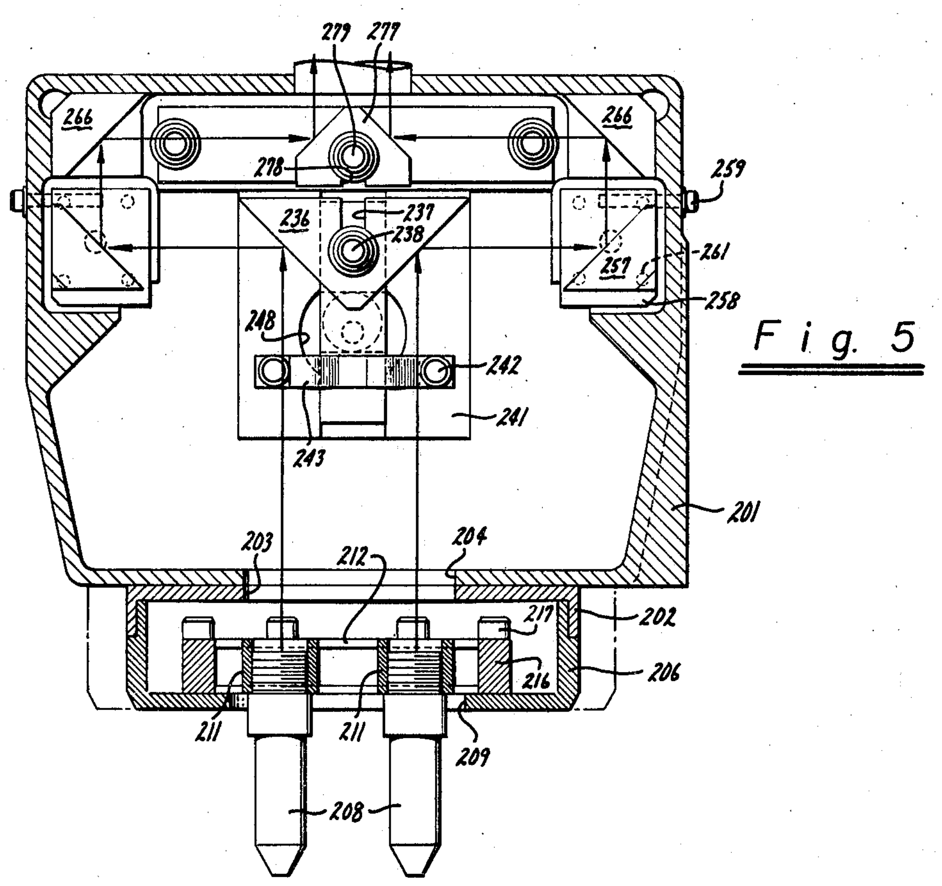
FIGURE 5 is a cross-sectional view taken along the line 5—5 of FIGURE 3.

More in particular, the mask alignment apparatus shown in the drawings consists of a large base or base casting 11 which has mounted thereon an optical assembly 12 and a control console 13. The base 11 can be formed as an integral unit as shown in the drawings and, for example, can be formed as a casting. A large cover or top plate 14 is mounted on top of the base 11 and lies generally in a horizontal plane. A conventional X–Y stage 16 is mounted in a large space 17 provided in the base 11 below the cover plate 14 and is secured to the base 11 by suitable means such as cap screws 18. A chuck assembly 19 of a rather unique construction is carried by the X–Y stage 16.

Figure 7:
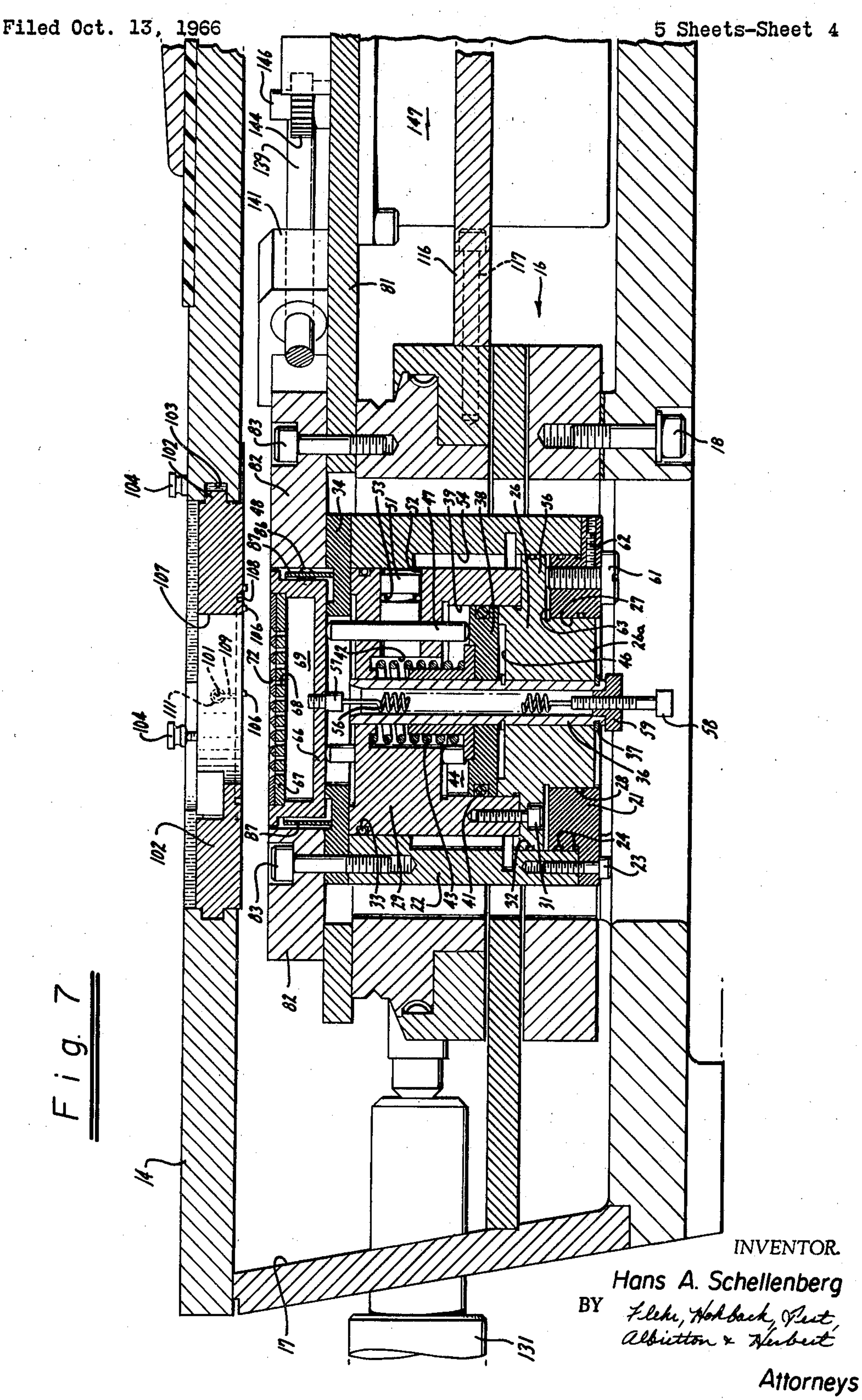
FIGURE 7 is an enlarged cross-sectional view of a portion of the apparatus and in particular shows the chuck assembly and the X–Y stage.

As shown particularly in FIGURE 7, the chuck assembly 19 consists of a bottom plate 21. A hollow cylindrical chuck housing 22 is secured to the bottom plate 21 by suitable means such as cap screws 23. Sealing means in the form of O-rings 24 are provided between the lower extremity of the chuck housing 22 and the bottom plate 21. A barrel plate 26 is mounted above the bottom plate 21 and is provided with a downwardly extending cylindrical portion **26*a* which fits within a hole 27 provided in the bottom plate. Sealing means is provided for establishing sealing enegagement between the bottom plate 21 and the extension 26*a* of the barrel plate in the form of an O-ring 28. A barrel 29 is disposed within the chuck housing 22 and is secured to the barrel plate 26 by cap screws 31. A seal is formed between the barrel plate 26 and the chuck housing 22 by an O-ring 32 and a seal is also formed between the barrel 29 and the chuck housing 22 in the form of an O-ring 33. A ring or collar 34 is mounted on the chuck housing 22 and retains the barrel 29 within the housing 22**.

A cylindrical spring guide 36 is mounted in the barrel plate 26 and is retained therein by suitable means such as Truarc retaining rings 37. A piston 38 is slidably mounted upon the spring guide 36 and also travels in a bore 39 provided in the barrel 29. An O-ring 41 is provided for forming a seal between the outer periphery of the piston 38 and the barrel 29 in the form of an O-ring 41. A flanged sleeve 42 is also slidably mounted upon the spring guide 36 and has its lower extremity engaging the piston 38. A spring 43 encircles the upper portion of the flanged sleeve 42 and has one end engaging the flanged sleeve 42 and has the other end engaging the barrel 29 so that the spring 43 is concentric with the spring guide 36 and yieldably urges the piston 38 in a direction downwardly away from the barrel 29. A space 44 is normally present above the piston 38 and normally has a cross-sectional area which is greater than space 46 which is provided on the other side of the piston 38 for a purpose hereinafter described. The piston 38 engages three spaced parallel vertical pins 47 which are slidably mounted in the barrel 29 for vertical movement therein. The pins 47 are adapted to engage the bottom side of a vacuum chuck assembly 48. Means is provided for locking each of the pins in a predetermined vertical position and consists of a plunger 51 disposed in a horizontal bore 52 provided in the barrel 29. The plunger 51 carries sealing means in the form of an O-ring 53. The bores 52 are in communication with an annular recess 54 surrounding the barrel 29 and disposed between the barrel 29 and the chuck housing 22.

Means is provided for yieldably retaining the vacuum chuck assembly 48 in engagement with the pins 47 and consists of a tension spring 56 which has one end connected to a fitting 57 which is threaded into the vacuum chuck assembly 48. The other end of the spring 56 is secured to a screw 58 which is threaded into a nut 59 mounted in the lower extremity of the spring guide 36. The fitting 57 is provided with a small bleed orifice (not shown) for a purpose hereinafter described.

Means is provided for adjusting the travel of the barrel plate 26 and consists of screws 61 which are threaded upwardly through the bottom plate 21 and which has an upper extremity which is adapted to be engaged by the barrel plate 26. Set screws 62 are provided for holding the screws 61 in place. A small annular space 63 is provided above the bottom plate 21 and between the barrel plate 26 for a purpose hereinafter described.

The vacuum chuck assembly 48 consists of a cup-shaped member 66. A metal plate 67 is mounted in the upper portion of the cup-shaped member 66 and is provided with a plurality of holes 68 which are in communication with a chamber 69 formed in the vacuum chuck assembly 48. A sheet or plate 71 of a suitable material such as Teflon overlies the metal plate 67 and is secured thereto. The sheet 71 is provided with holes 72 which communicate with the holes 68 provided in the metal plate 67. A fitting 73 is mounted upon the cup-shaped member 66 and is adapted to be connected to a suitable source of vacuum such as through a hose 74 which is connected to a fitting 76 provided in the base 11. This fitting 76 is connected to a suitable source of vacuum. Three separate fittings (not shown) are mounted upon the chuck assembly 19 and are in communication with spaces 46, 54 and 63 in the chuck assembly. These fittings on the chuck assembly are connected to fittings 77 and 78 mounted upon the base 11 (see FIGURE 1) which are connected to suitable sources of fluid pressure such as 20 p.s.i. and 80 p.s.i., respectively.

A mounting plate 81 is disposed between the vacuum chuck assembly 48 and the chuck assembly 19. A loading plate 82 overlies the mounting plate. The loading plate 82 and the mounting plate 81 are secured to the rotational part of the X–Y stage 16 and the chuck housing 22 by cap screws 83. Means is provided to cause true vertical movement of the vacuum chuck assembly 48 within the loading plate 82 and consists of a plurality of balls 86 which are carried by a retaining ring 87 surrounding the vacuum chuck assembly 48. The balls 86 travel in V-blocks 88 carried by the loading plate 82 (see FIGURE 8). The V-blocks 88 are held in place by set screws 89. The vacuum chuck assembly 48 is spring-loaded against the balls 86 guided by the V-blocks 88 by a ball-carrying plunger 91 mounted in the loading plate 82 and engaging a flat 92 provided on the vacuum chuck assembly 48. A leaf spring 93 engages the plunger 91 and is secured to the loading plate 82 by screws 94.

A mask holder slide 101 is mounted in the cover or top plate 14. The mask holder slide 101 is provided with spaced parallel tongues 102 which travel in ways 103 provided in the top plate 14. Means is provided for holding the mask holder slide 101 in a desired position in the ways 103 and consists of three thumb screws 104 which are threaded into the slide 101 and engage the top surface of top plate 14. The thumb screws serve to draw the upper surface of the tongues 102 into engagement with the upper surfaces of the ways 103 to frictionally hold the slide 101 in the desired position.

The mask which is to be held by the mask holder slide 101 is adapted to be positioned on the bottom of the slide in engagement with three spaced registration pins 106 mounted in the bottom side of the slide 101. The pins 106 are mounted about an exposure aperture 107 provided in the slide 101 so that the mask is held in a predetermined position with respect to the viewing aperture. Additional means is also provided for holding the mask in the desired position on the slide 101 and consists of an annular groove 108 adjacent the aperture 107 and which opens downwardly. The groove 108 is in communication with a passage 109 provided in the slide 101. A fitting 111 is threaded into the slide 101 and communicates with the passage 101. A tube 112 is mounted on the fitting 111 and is connected to a suitable source of vacuum which is utilized for applying a vacuum to the groove 108 to bring the mask into engagement with the slide 101 and to hold the same in the desired registration with the aperture 107 as hereinafter described.

Means is provided for causing relative movement between the mask holder slide 101 and the chuck assembly 19 and includes the X–Y stage 16 which is utilized for moving the chuck assembly 19 along X and Y axes relative to the slide 101. The X–Y stage 16 is of conventional construction and, therefore, will not be described in detail. The X–Y stage is moved by a large plate 116 which is secured to the X–Y stage by cap screws 117. The plate 116 serves as a link and is connected to a flanged sleeve 118 which is guided by a large positioner ball 119. An arm 121 is mounted upon the ball 119 which is provided with a ball 122 on its lower end and a smaller ball 123 on its upper end. The ball 122 is mounted in the socket plate 124 which is secured to the base 11. The ball 122 is held in place by a retaining plate 126 secured to the socket plate 124 by cap screws 127. A knob 129 which is adapted to be grasped by the hand is mounted on the small ball 122 and rests upon the top plate 14. The knob 129 is adapted to be shifted in X and Y directions upon the surface of the top plate 14 to cause corresponding movement of the X–Y stage 14. An annular recess 130 is formed in the top plate 14 beneath the knob 129 and is adapted to be connetced to a source of vacuum to prevent movement of the knob 129 until the vacuum is removed from the recess 130. A button 128 is provided on the control knob 129 which, when actuated, causes a vacuum to be supplied to the recess 130 and also causes separation of the wafer and the mask as hereinafter described.

Means of a conventional type is also provided for rotating the chuck assembly 19 about a vertical axis and includes a knob 131 which, as the knob is rotated, causes rotation of the chuck assembly 19.

Means is provided for automatically advancing the wafer onto the chuck assembly 19 and for discharging the wafer which was previously on the chuck assembly 19 and includes a wafer slide 136. The wafer slide 136 is secured to a mounting block 137 by suitable means such as screws 138. The mounting block 137 is affixed to a rack 139 by a press fit. The rack 139 travels in bearing blocks 141 and 142 which are secured to the loading plate 82 by cap screws 143. The rack 139 is driven by pinion 144 which is mounted on the output shaft 146 of a motor 147. The motor 147 can be of any suitable type such as a "Slosyn" motor manufactured by Superior Electric. A spring 148 is mounted on the rack 139 and is disposed between the mounting block 137 and the bearing block 142. The end of the spring 148 remote from the mounting block 137 is retained by a Tru-Arc ring 149 secured to the rack 139.

An adjusting screw 151 is slidably mounted in the bearing block 142 and is threaded through the mounting block 137 and is adapted to be adjusted longitudinally of the mounting block. It is held in the desired position by a lock nut 152. The screw 151 is provided with a knob 153 to facilitate hand adjustment of the screw 151. The screw 151 is provided with a tip 151*a* which is adapted to engage a microswitch as hereinafter described.

Means is provided for yieldably urging the wafer slide 136 into engagement with the loading plate 82 and consists of a triangular-shaped leaf spring 156 which is also secured to the mounting block 137 by screws 138. The leaf spring is provided with a rounded bearing member 157 which engages the upper side of a guide member 158 secured to the mounting plate 81 by screws 159. The guide member 158 is provided with a cut-out 161 in which an actuating arm 162 travels. The actuating arm 162 is secured to the rack 139 by set screw 163. The actuating arm 162 is adapted to engage the operating arms of microswitches MS–1, MS–2 and MS–3 carried by the plate 81. A microswitch MS–4, also carried by the plate 81, has an operating arm which is adapted to be engaged by the point 151*a* of the adjusting screw 151 as hereinafter described.

The wafer slide 136 is provided with a forward edge 166. The wafer slide 136 is also provided with a substantially rectangular opening 167. One side of the opening is formed by an edge 168 which is adapted to engage the flat surface 169 of a wafer 171. The wafer 171 is shown with a broken line. The wafer slide is provided with recesses 136*a*, 136*b*, 136*c* and 136*d* which are adapted to receive the corners of a mask for a purpose hereinafter described.

Figures 8, 9, 10:
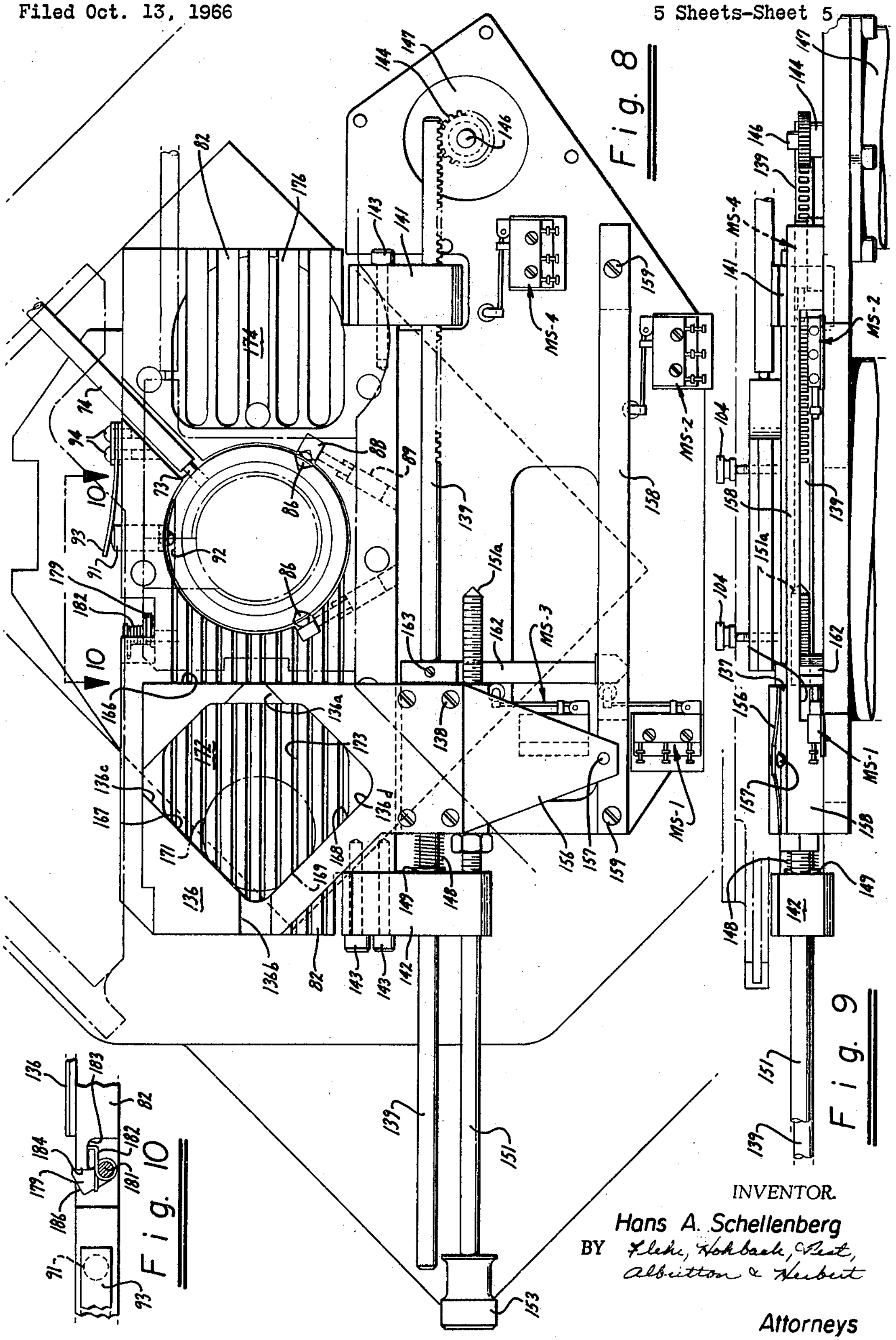
FIGURE 8 is a top plan view of a portion of the apparatus with certain parts removed and particularly showing the loading assembly.
FIGURE 9 is a side elevational view of a portion of the apparatus shown in FIGURE 8.
FIGURE 10 is a partial side elevational view looking along the line 10—10 of FIGURE 8.

The wafer 171 in the position shown in FIGURE 8 rests upon a portion of the loading plate 82 which can be identified as the loading station 172. The loading station is provided with a plurality of spaced parallel longitudinally extending grooves 173 which lead up to the chuck assembly 19. The other side of the chuck assembly is provided with an unloading or discharge station 174 which is provided with a plurality of larger spaced parallel grooves 176 leading from the chuck assembly 19.

Means is provided for raising the wafer slide 136 after it has deposited a wafer on the chuck assembly 19 and consists of a pawl 179 mounted upon a pin 181 carried by the loading plate 82 (see FIGURE 10). A spring 182 is mounted on the pin 181 and has one end engaging the pawl 179 and has the other end engaging the surface 183 of the plate 82. The spring 182 thus serves to normally yieldably urge the pawl 179 into engagement with a surface 184 provided on the plate 82. As can be seen from FIGURE 10, when the slide 136 is moved to the right, it engages the pawl 179 and urges the same to the left away from the surface 82 and downwardly so that the wafer slide 136 readily clears the pawl. On the other hand, when the wafer slide is returned, the wafer slide is cammed upwardly by the inclined surface 186 of the pawl 179 because the pawl 179 is in engagement with the surface 182 to raise the slide and to permit it to pass over the wafer previously deposited as hereinafter described.

The optical assembly of the mask alignment apparatus can be seen particularly in FIGURES 1–6. The optical assembly consists of an X–Y stage 191 of a conventional construction which is mounted on the top plate 14 in which the knob 192 provides the X or longitudinal motion and the knob 193 provides the Y or transverse motion. A rack and pinion assembly 196 is mounted upon the X–Y stage 191 and also is of a conventional type. It has a knob 197 which provides the coarse adjustment for Z type or vertical motion provided by the rack and pinion assembly 196 and a knob 198 which gives a fine adjustment for this same motion.

An optical housing 201 is mounted upon the rack and pinion assembly 196 and can be moved in the X, Y and Z directions by operation of the knobs hereinbefore described. A mounting member 202 is secured to the bottom of the housing 201 and is provided with a hole 203 which is in registration with the hole 204 provided in the housing 201. A turret 206 is rotatably mounted within the mounting member 202 and is rotatable about a pivot screw 207 secured to the housing 201.

A pair of objective lens assemblies 208 are mounted in the turret 206 and extend through opening 209 provided in the turret and are threaded into slide blocks 211. The slide blocks 211 are slidably mounted in spaced parallel guide blocks 212 secured to the turret by cap screws 213. Means is provided for adjusting the spacing between the objective lens assemblies 208 and consists of an elongate threaded rod 214 which is provided with threaded portions 214*a* and 214*b* with one of the portions being threaded in one direction and the other of the portions being threaded in an opposite direction. The threaded portions are threaded into the blocks 209 shown particularly in FIGURE 6. The threaded portions are also threaded into blocks 216 secured to the turret 206 by cap screws 217. A knob 218 is mounted on one end of the threaded rod 212 for turning the same. The other end of the rod 214 is mounted in a bushing 219 carried by the turret 206. It can be seen by rotation of the knob 218 in opposite directions, the objective lens assemblies 208 will either be moved closer to each other or farther apart from each other.

Figure 6:
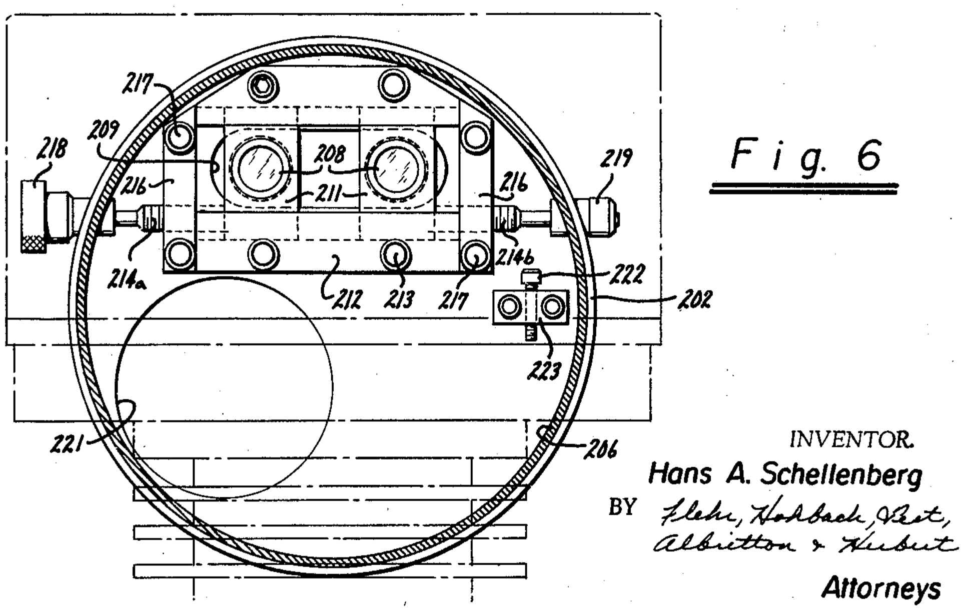
FIGURE 6 is a cross-sectional view taken along the line 6—6 of FIGURE 1.

The turret 206 is provided with a large hole 221 through which exposures can be made as hereinafter described. The turret in the position shown in FIGURE 6 is in the viewing position. The turret is movable into a position in which one of the guides 212 is in engagement with stop screw 222 carried by a bracket 223 secured to the mounting member 202. In this position, the hole 221 is in a position to permit an exposure as hereinafter described.

A lamp housing 226 is mounted upon the top mounting plate 14 and includes a lamp (not shown) of a suitable type. A finned collimating lens assembly housing 227 is mounted on the lamp housing 226 and on the optical housing 221. Light from the lamp in the lamp housing 226 passes through the collimating lenses provided in the housing 227 and travels through a pair of filters 228 (see FIGURE 3) provided on the optical housing 221 and strikes a beam splitter 231. The beam splitter 231 is carried at an angle within the housing 201 and is supported by a block 232 and retained therein by a set screw 233. The block 232 is secured to the optical housing 201 by screws 234. The light striking the splitter 231 is reflected downwardly through the objective lens assemblies 208 onto the mask and then is reflected from the mask through the lens assemblies 208 and through the beam splitter 231 up towards a dividing prism 236 which is provided with a slot 237 intermediate the ends of one side of the triangular-shaped prism. The prism 236 is held in place by a cap screw 238 threaded into a slide 239. The slide 239 travels in a guide plate 241 which is secured to the optical housing 201 by cap screws 242. The cap screws 242 also extend through a spring-like member 243 which overlies the slide 239.

Adjustable means is provided for adjusting the position of the slide 239 within the guide plate 241 and consists of an eccentric 246. The slide 239 is provided with a cutout 247 which is adapted to receive the eccentric 246 as can be seen from FIGURE 3. In addition, the guide plate 241 is provided with a circular opening 248 to permit rotary movement of the eccentric. A shaft 249 is secured to the eccentric and a knob 251 is secured to the shaft by a set screw 252. By movement of the knob 251, it can be seen that the slide 239 can be raised and lowered to raise and lower the prism 236 carried thereby.

After the light beams are reflected by the dividing prism 236, they strike reflecting prism assemblies 256 mounted on opposite sides of the optical housing 201. Each prism assembly 256 consists of a prism 257 mounted upon a mounting block 258 secured to the optical housing 201 by a cap screw 259. The mounting block 258 with the prism 257 carried thereon is adapted to be shifted in position by three separate tilting screws 261 which are mounted in the housing 201 and which engage the rear side of the mounting block 258 as viewed in FIGURE 5.

The light beams after they are reflected off of the prism 257 strike the prisms 266 mounted on opposite side corners of the optical housing 201. The light is then reflected onto a prism 277. The prism 277 is provided with a slot 278 through which a cap screw 279 extends. The cap screw 279 is threaded into a plate 281 which is secured to the housing 201 by a screw 282. The light then travels through a hole 283 provided in the housing into a folded optics assembly housing 284. A conventional lens assembly 286 is secured to the housing 284 by a set screw 285 and is adapted to receive the light as it is reflected from the prism 277. The light passes from the lens assembly 286 to a unique prism assembly 287. The prism assembly 287 consists of a U-shaped frame 288. A large right-angle prism 289 is mounted within the frame 288 and a small right-angle prism 291 is mounted in the frame 288 and overlies the prism 289. The smaller prism 291 is held in place by cementing it to the U-shaped frame 288. The larger prism 289 is held in place by small set screws 292 which are threaded through the U-shaped frame 288 and engage the prism 289.

It should be pointed out in this U-shaped prism assembly 287 that faces of the two prisms 289 and 291 which abut each other are retained in close intimate contact by the U-shaped frame hereinafter described. The prism assembly 287 is secured to a mounting plate 293 by screws 294. The plate 293 is held in place on the housing 284 by a large cap screw 296. It will be noted that in the arrangement shown the plate 293 is positioned so that the U-shaped prism assembly 287 forms an angle of 45° with respect to the light travelling through the lens assembly 286. The light from the U-shaped prism assembly passes through a compound lens assembly 297 of a conventional type mounted within the housing 284. A binocular head 298 of conventional construction is mounted on the housing 284 and is adapted to receive light through the compound lens assembly 297. The binocular head 298 is held in place by a thumb screw 299 threaded into a housing 284. The binocular head 298 is provided with a pair of spaced eye pieces 301 of conventional type.

A shutter 229 is pivotally mounted upon the housing 201 by a screw 230 and can be moved into open and closed positions with respect to light passing through the filters 228. In practice, the shutter 229 can be motorized by the use of a rotary solenoid. Operation and use of the mask alignment apparatus may now be briefly described as follows.

The mask alignment apparatus also includes electronic circuitry which is mounted in the control console 13. This electronic circuitry includes the following microswitches which perform the functions listed below:

MS–1—home limit
MS–2—mask loading
MS–3—return
MS–4—early vacuum

The control console 13 also includes various controls such as a timer 301, a plurality of switches 302 and indicating lights 303 which operate in conjunction with the electronic circuitry carried by the console 13.

Operation and use of the mask alignment apparatus may now be briefly described as follows: Let it be assumed that it is desired to use the apparatus for aligning masks with wafers on which semiconductor devices are to be formed by the use of conventional photolithographic techniques. The operator first takes the mask which is to be used in conjunction with the mask alignment apparatus and places it upon the wafer slide 136 so that it rests upon the wafer slide. Preferably, the mask is rectangular and the corners of the mask are disposed in the recesses **136*a*, 136*b*, 136*c* and 136*d* of the wafer slide 136. The operator then operates a foot switch (not shown) which places the apparatus in operation by starting rotation of the Slosyn motor 147. Rotation of the Slosyn motor causes clockwise rotation of the pinion 144 as viewed in FIGURE 8 which causes the rack 139 and the wafer slide 136 mounted thereon to move to the right as viewed in FIGURE 8. As soon as the rack 139 moves to the right, the arm 162 releases the operating arm of the home limit microswitch MS–1. The Slosyn motor 147 remains energized and continues to advance the wafer slide 136 until the actuating arm 162 engages the mask loading microswitch MS–2. Operation of the microswitch MS–2 deenergizes the motor 147. When this occurs, the mask which is carried by the wafer slide 136 is immediately below the mask holder slide 101. Since the masks are normally of the same size, the microswitch MS–2 can be mounted in a fixed position to always stop the movement of the wafer slide 136** in the same position.

After the wafer slide 136 is in position below the mask holder slide 101, the operator rotates the knob 153 in a clockwise direction viewed as the hand is facing the knob 153 to raise or tilt the wafer slide 136 upwardly and to bring the mask into closer proximity with the mask holder slide 101. As soon as this is done, the vacuum which is normally on and which is taking in air through the annular groove 108 causes the mask to be raised upwardly and into engagement with the mask holder slide 101 and to be held in a predetermined position by the registration pins 106 carried by the slide 101. As explained previously, the vacuum is applied to the annular groove 108 through the passage 109 from the tube 112. The mask is held in position on the slide 101 throughout the operation as hereinafter described.

After the mask loading has been completed, the operator operates one of the switches on the control console 13 to again energize the motor 147 to cause the rack 139 and the wafer slide 136 carried thereby to be returned to the home position in which the actuating arm 162 energizes the microswitch MS–1 to stop the motor 147.

The operator next takes a wafer on which semiconductor devices are to be formed by the use of conventional photolithographic techniques and places it upon the loading station 172 of the loading plate 82 with the flat of the wafer in engagement with the surface 169 of the slide 136. The operator then again operates the foot switch to energize the motor 147 to cause the rack 139 to be advanced. As the rack is advanced, it compresses the spring 148 which is secured to the rack 139 by the retaining ring 149 which engages the mounting block 137 to cause the mounting block with the wafer slide 136 thereon to be shifted to the right as viewed in FIGURE 8 and to advance the wafer 171 on the loading plate 82 towards the chuck assembly 19. As soon as the rack 139 is advanced, the actuating arm 162 releases the home limit microswitch MS–1. Continued rotation of the motor 147 causes the rack 139 and the wafer slide 136 carried thereby to advance. The actuating arm 162 eventually operates the microswitch MS–2, but in this case the microswitch MS–2 is ineffective because of the operation of the switch on the control console 13. Continued rotation of the motor 147 causes the point **151*a* of the adjusting screw 151 to engage the operating arm of the early vacuum microswitch MS–4. This early vacuum switch causes a vacuum to be supplied to the tube 74 which, in turn, supplies the vacuum to the chamber 69 and to thereby cause air to be drawn through the hole 68 into the chamber 69. This occurs at the time that the wafer 171 is over the chuck assembly 19 and serves to create a slight drag on the substrate just immediately before the wafer slide 136** has reached its final destination. This slight drag is placed on the wafer to assure precise positioning of the wafer on the chuck assembly. If this slight drag were not placed on the wafer, it is possible that the wafer might over-travel because of inertia. The timing for placing this early vacuum on the wafer can be changed by shifting the position of the microswitch MS–4.

Continued rotation of the motor 147 causes the knob 153 to engage the bearing block 142 which stops further movement of the wafer slide 136. It can be readily seen that by adjusting the position of the adjusting screw 151 in the block 137, it is possible to precisely determine the point at which the wafer slide 136 will stop with respect to the chuck assembly 19. Even though the knob 153 strikes the bearing block 142, the rack 139 will continue to move to the right under the action of the motor 147 which carries with it the actuating arm 162 to move the same away from the bearing block 137 and to release the operating arm of the return microswitch MS–3. Operation of this microswitch MS–3 causes the direction of rotation of the motor 147 to be reversed and to move the rack 139 in an opposite direction. The actuating arm 162 then comes into engagement with the block 137 and the operating arm of the microswitch MS–3 is engaged. Return movement continues until the actuating arm 162 engages the operating arm of the microswitch MS–3 to stop the rotation of the motor 147 to place the apparatus in its at-home position.

It should be pointed out that the time the wafer slide 136 is being advanced, it engages the pawl 179 to shift it to the left as viewed in FIGURE 10 so that the wafer slide can readily move over the same. However, upon return of the wafer slide 136 as hereinbefore described, the pawl 179 is returned to its position in engagement with a surface 184 and will cause the wafer slide 136 to be cammed upwardly so that it will clear the wafer which has just been placed upon the chuck assembly 19.

At the time that the switch MS–1 is operated by the return of the actuating arm 162, two solenoid-operated valves (not shown) are operated, one of which supplies a gas such as nitrogen under suitable pressure, such as 20 p.s.i., and the other of which also supplies a gas, such as nitrogen, under suitable pressure, such as 20 p.s.i. The 20 p.s.i. pressure is applied to the space 46 between the barrel plate 26 and the piston 38 to cause the piston 38 to be moved upwardly as viewed in FIGURE 7 against the force of the spring 43 and to move upwardly with it the three pins 47. The pins cause the vacuum chuck assembly 48 to be moved upwardly with the wafer 171 carried thereon until the wafer and the chuck assembly engage the mask carried by the mask holder slide 101. The piston 38 is capable of slight floating movement which makes it possible to change its angle slightly from the horizontal to ensure that all three pins are urged upwardly into engagement with the vacuum chuck assembly 48. This floating movement of the piston 38 is made possible by the O-ring 41 which forms a good seal between the piston 38 and the barrel 29.

At the same time that the floating piston 38 is moving upwardly, the 80 p.s.i. fluid is supplied to the space 63 between the barrel plate 26 and the bottom plate 21 to cause the barrel plate 26 to move upwardly a slight amount. The travel of the barrel plate 26 is relatively small and is determined by the distance between the top of the barrel 29 and the ring or collar 34. This separation is adjustable by adjusting the position of the adjusting screws 61. Thus, with both the 20 p.s.i. pressure and the 80 p.s.i. pressure being applied to the chuck assembly 19, it can be seen that the wafer carried by the chuck assembly is firmly held in place against the mask.

The operator then views the geometry on the mask with the geometry which is on the wafer to determine whether they are in alignment by looking through the eye pieces 301. This is, of course, assuming that there has already been some work done on the wafer. Now let it be assumed that the pattern on the mask and the pattern on the wafer are out of alignment with each other and it is desired to bring them into alignment. The operator then presses a button 128 on the knob 129 which causes the 80 p.s.i fluid to be supplied to the annular recess 54 in the chuck assembly. As soon as this occurs, the fluid under pressure is supplied to the plungers 51 which, in turn, engage the pins 47 to lock the pins 47 in the position in which they were being held by the piston 38.

After a predetermined time delay which is provided by the electronics in the control console 13, the 80 p.s.i. pressure which is being applied to the space 63 is removed and the space is exhausted to the atmosphere. When this occurs, the barrel 29, the piston 38 and the barrel plate 26 are urged downwardly by the pressure in recess 54 into engagement with the three levelling screws 61. They travel downwardly by a predetermined distance as, for example, 1 mil. As soon as the separation has been completed, the vacuum which has been placed on the search knob 129 is released so that the operator is free to move the search knob. Even though the pins 47 are also lowered, they are held in a predetermined position with respect to the barrel 29. The operator is, therefore, free to shift the wafer 171 carried by the chuck assembly 19 by moving the various controls of the X–Y stage 16 as well as the rotational control 131 to move the wafer into exact registration with the mask carried by the mask holder slide 101. Thereafter, the operator releases the button 128 on search knob 129 to again place a vacuum in the groove 130 to hold the search knob 129 in the selected position. At the same time, the 80 p.s.i. fluid is supplied to the space 63 to raise the barrel plate 26, the piston 38, the barrel 29 and the pins 47 upwardly until the pins engage the vacuum chuck assembly 48 to move the same upwardly and to cause the wafer 171 to come in contact with the mask carried by the mask holder slide 101 so that there is a minimum air gap between the wafer and the mask. The operations to be performed are then carried out as, for example, an emulsion on the wafer can be exposed to a predetermined pattern carried by the mask by ultra-violet or bluish ultra-violet light from the lamp within the lamp housing 226.

As soon as this has been completed, the operator causes the 20 and 80 p.s.i. pressures from the chuck assembly to be removed and permits the spaces which previously had been filled to be exhausted to the atmosphere. This permits the chuck assembly 19 with the wafer 171 to be lowered to their normal positions.

The apparatus can now be operated in a manner hereinbefore described. When the next wafer 171 is placed on the wafer slide 136 and the wafer slide is advanced, the forward edge 166 of the wafer slide engages the wafer still on the chuck assembly 19 and pushes the same off of the chuck assembly onto the unloading station 174 carried by the loading plate 82. They are now in a position where they can be removed by an operator for further processing as required.

The operation and control of the optical assembly 12 which forms a part of the apparatus may now be briefly described. Light is supplied from the lamp within the lamp housing 226 through the filters 228 to the beam splitter 231 which causes the light to be reflected downwardly through the objective lens assemblies 208 and down onto the mask and the wafer. Light is reflected from the wafer and passes upwardly through the objective lens assemblies 208 and through the beam splitter 231 which causes the light to be directed in two opposite directions onto prisms 257 which again reflect the light at right angles onto the additional prisms 266 and which again reflect the light at right angles onto a prism 277 upwardly through a lens assembly 286 and from there through a lens assembly 297 to the eye pieces 301. The optical assembly can be shifted to bring the images into focus and into proper alignment by using the knobs 191 and 193 for controlling the X and Y motions of the X–Y stage 191 and the knobs 196 and 198 can be utilized for making the coarse and fine vertical adjustments or adjustments along the Z axis.

The optical assembly herein described has a number of advantages. First, the optical assembly is one which utilizes what can be called folded optics. By this, it is meant that the optical path is folded or is substantially reduced in vertical height so that the eye pieces 301 can be positioned at a lower elevation so it is convenient for eye operation by personnel having relatively short stature.

The optical assembly has excellent qualities because roof prisms and assemblies thereof are utilized to achieve image reversals and inversions. With the roof prism construction utilized, it is unnecessary for the light to pass through the glass of which the prism is formed. Rather, the light is reflected from the surfaces of the prism and need not pass through the glass. This is particularly advantageous because it eliminates the necessity for compensating for the change in the index of refraction as the light beam passes through the glass. In addition, it eliminates any image deterioration which occurs when the light passes through the glass.

It is apparent from the foregoing that there has been provided a new and improved mask alignment apparatus which has many desirable features. The apparatus is one which is substantially automatic and which is capable of performing complicated functions and can be made so that it works with very fine tolerances as, for example, 1 micron or better. The apparatus is such that it can be operated by relatively unskilled personnel.

I claim:

1. In a mask alignment apparatus for aligning a mask with a wafer, a base, a holder carried by the base, and for receiving a mask, a chuck assembly for carrying the wafer to be aligned with the holder, means mounting the chuck assembly on the base for causing relative movement between the chuck assembly and the holder in X, Y and Z directions, said chuck assembly including a movable part and a plurality of pins mounted in the movable part and movable in a Z direction to cause movement of the wafer in a Z direction toward the mask, and piston means carried by the chuck assembly for moving said pins so that the wafer is moved into contact with the mask.

2. Apparatus as in claim 1 together with means for locking said pins in a predetermined position with respect to the movable part of said chuck assembly when said pins have been moved to bring the wafer into contact with the mask.

3. Apparatus as in claim 1 wherein said piston means is in the form of a single piston and spring means carried by the piston normally yieldingly urging said piston in a direction opposite the direction in which the pins are to be moved.

4. In an alignment apparatus, a base, a holder carried by the base, a chuck assembly for carrying the article to be aligned with the holder, means mounting the chuck assembly on the base for causing movement of the chuck assembly relative to the holder, said chuck assembly including a chuck housing, a barrel slidably mounted in the housing, a piston slidably mounted in the barrel, a plurality of pins slidably mounted in said barrel and engageable by the piston, said pins being movable to urge the article into engagement with the holder, means for locking said pins in said barrel, means for moving said pins and the barrel carrying said pins away from the mask and the holder so that the relative positions of the article and the holder can be shifted, and means for returning said barrel and the pins carried thereby so the pins again cause the article to be moved into engagement with the mask carried by the holder.

5. In a mask alignment apparatus, a base, a holder carried by the base, said holder receiving a mask on the underside thereof, a chuck assembly, said chuck assembly including plate means and means for securing the article to be aligned on the plate means in a desired position, means mounting the chuck assembly on the base for causing movement of the chuck assembly relative to the holder, said chuck assembly including a chuck housing, a barrel slidably mounted in the housing, a piston slidably mounted in the barrel, a plurality of pins slidably mounted in the barrel and engageable by the piston, said pins being movable by said piston into engagement with said means carrying the article to be aligned, and means yieldably urging the plate in a direction opposite the direction it is normally urged by said pins.

6. Apparatus as in claim 5 together with means for locking said pins in the positions they are in after the article has been moved into engagement with the mask, and means for urging said piston, said barrel and said pins in a direction in which the pins are moved so that the article moves out of engagement with the mask, and means for adjusting the distance said pins, barrel and piston are moved away from the mask.

7. Apparatus as in claim 5 wherein said holder includes a plurality of pins, a groove formed in said holder and facing downwardly, and vacuum means connected to said groove for applying a vacuum to said groove, said mask being in engagement with said groove and being held in contact with said holder by the vacuum in said groove.

8. Apparatus as in claim 5 wherein said plate means includes a chamber and vacuum means connected to the chamber to supply a vacuum to the chamber, said plate means being formed with holes which underlie the article so that the article is held in engagement with the plate means.

9. Apparatus as in claim 5 together with means for loading and unloading articles onto said chuck assembly, said loading and unloading means including a wafer slide movable in a direction at right angles to the movement of said pins, said wafer slide having a surface adapted to be engaged by the article to be positioned on the chuck assembly.

10. Apparatus as in claim 9 together with automatic means for positioning said wafer slide, said automatic means including a motor, a pinion driven by said motor, a rack engaged by said pinion, means for securing said wafer slide to said rack, and means for limiting travel of said wafer slide.

11. Apparatus as in claim 8 together with means engaged by the wafer slide for supplying a vacuum to said chamber to prevent over-travel of said article.

12. In an alignment apparatus, means for causing relative movement between the two objects to be aligned, and optical means for observing said articles, said optical means including a source of light, means for directing the source of light to the articles, means for receiving reflected light from the article in two different paths, a pair of eye pieces, and means for reflecting said pair of image carrying beams to said eye pieces, said image carrying means including a roof prism assembly.

13. Apparatus as in claim 12 wherein said roof prism assembly includes a pair of right-angle roof prisms and means for securing said pair of roof prisms into a unitary assembly so that the light images are reflected from the surfaces of the assembly.

14. Apparatus as in claim 12 wherein said roof prism assembly includes a pair of right-angle prisms, a substantially U-shaped bracket, and means for mounting said right-angle prisms in said U-shaped bracket so that said prisms form right-angle reflecting surfaces with respect to each other.

15. In a mask alignment apparatus for aligning a mask in a wafer, a base, a holder for carrying the mask, a chuck assembly adapted to carry the wafer, means mounting said holder and said chuck assembly on said base for causing relative movement in X and Y directions between said holder and said chuck assembly, a wafer member mounted on said base and having at least one wafer engaging surface for positioning the wafer in a position away from the chuck assembly, means for moving said wafer member from said position away from said chuck assembly into a position so that the wafer engaging surface is generally overlying the chuck assembly, and means mounted on the base for causing relative movement in a Y direction between said chuck assembly and said holder, said wafer member being positioned so that the wafer carried by the wafer member can be engaged by the chuck assembly and moved into contact with the mask carried by the holder.

16. A mask alignment of an apparatus as in claim 15 together with optical means for viewing the alignment of the mask with the wafer, said optical means also including means for causing light to pass through said mask and to impinge upon said wafer.

17. In a mask alignment apparatus as in claim 16 wherein said optical means includes a turret movable between a viewing position for determining alignment of the wafer and the mask and an exposing position for permitting light to pass through said mask and onto said wafer.

18. A mask alignment apparatus as in claim 15 wherein said wafer member is formed with a substantially V-shaped recess for receiving a wafer and to retain said wafer in a predetermined position away from the chuck assembly.

19. A mask alignment apparatus as in claim 15 wherein said wafer member having wafer engaging surfaces and said means for moving the wafer member into a position overlying the chuck assembly comprises a wafer member having a substantially V-shaped recess therein for receiving the wafer and for positioning the same in a predetermined position away from the chuck assembly and a means mounted on the base for engaging the wafer member for moving the wafer slide in a direction towards the chuck assembly so that the wafer carried thereby is moved into position generally overlying the chuck assembly.

20. A mask alignment apparatus as in claim 15 wherein said means for moving the wafer member includes means for returning the wafer member to said position away from said chuck assembly.

21. A mask alignment apparatus as in claim 15 wherein said means for moving said wafer member includes automatically operated motive means.

22. A mask alignment apparatus as in claim 15 wherein the wafer member is a wafer slide and wherein the movement of said wafer member is rectilinear.

23. A mask alignment apparatus as in claim 22 wherein said wafer slide is provided with a substantially rectangular recess and wherein said wafer slide is provided with a surface for engaging a wafer on the chuck assembly to move the wafer away from the chuck assembly as a new wafer is advanced onto the chuck assembly.

24. A mask alignment apparatus as in claim 22 together with means for shifting the position of the wafer slide so that it clears the wafer placed on the chuck assembly upon return of the wafer slide to the position away from the chuck assembly.

25. A mask alignment apparatus as in claim 15 wherein said means for causing movement of the chuck assembly and the holder in a Z direction with respect to each other includes means for maintaining a predetermined separation in a Z direction between mask carried by the holder and the wafer carried by the chuck assembly.

26. A mask alignment apparatus as in claim 15 wherein said means for causing relative movement in X and Y directions between the chuck assembly and the holder includes joy stick means.

References Cited

UNITED STATES PATENTS 3,149,510 9/1964 Schellenberg -------- 350—86

RONALD L. WIBERT, Primary Examiner

T. R. MOHR, Assistant Examiner

U.S. Cl. X.R.

269—21